(12) United States Patent
Mahurin

(10) Patent No.: US 7,821,298 B2
(45) Date of Patent: Oct. 26, 2010

(54) MULTIPLEXING USING PRODUCT-OF-SUMS AND SUM-OF-PRODUCTS

(76) Inventor: Eric Mahurin, 7105 Ridge Oak Rd., Austin, TX (US) 78749

( * ) Notice: Subject to any disclaimer, the term of this patent is extended or adjusted under 35 U.S.C. 154(b) by 0 days.

(21) Appl. No.: 12/189,162

(22) Filed: Aug. 10, 2008

(65) Prior Publication Data

US 2010/0033212 A1 Feb. 11, 2010

(51) Int. Cl.
*H03K 19/20* (2006.01)
(52) U.S. Cl. .................. 326/104; 326/105; 326/106

(58) Field of Classification Search .............. None
See application file for complete search history.

(56) References Cited

U.S. PATENT DOCUMENTS 5,773,995 A * 6/1998 Crocker ............... 326/108
6,982,589 B2 * 1/2006 Veeramachaneni et al. .. 327/408

* cited by examiner

*Primary Examiner*—Anh Q Tran

(57) ABSTRACT

A method for and the results of implementing a tree of multiplexing are disclosed. At each level of the tree, a sum-of-products or a product-of-sums representation is chosen to maximize inter-level optimizations.

19 Claims, 8 Drawing Sheets

MULTIPLEXING USING PRODUCT-OF-SUMS AND SUM-OF-PRODUCTS

FIELD OF THE INVENTION

The present invention relates generally to digital logic design and in particular to digital multiplexing.

REFERENCES

[Mitra2000] S. Mitra, L. J. Avra, E. J. McCluskey, "Efficient Multiplexer Synthesis Techniques", IEEE Design & Test of Computers 17(4): 90-97 (2000)

[Norwood1997] R. B. Norwood, E. J. McCluskey, "Delay Testing for Sequential Circuits with Scan," CRC TR 97-5, Nov. 1997.

[Campbell2004] B. J. Campbell, "High-fanin static multiplexer", U.S. Pat. No. 7,129,755.

BACKGROUND OF THE INVENTION

In logic design, a common function needed is for multiplexing. An N-to-1 multiplexer selects 1 of N data sources and outputs a representation of that data. In hardware description languages, conditional constructs such as "if" and "case" typically imply multiplexing logic. Sometimes an explicit conditional/multiplexing operator is used in a hardware description language (usually only for 2-to-1 multiplexing). Sequentially conditional or enabled logic (also usually described by conditional constructs just mentioned) may also imply multiplexing logic where one or more data sources may be sequential feedback.

Multiplexing may be implemented by a tree of multiplexers. To implement N-to-1 multiplexing using a tree, divide the N inputs into M groups, multiplex each group of inputs to 1 signal, and finally use M-to-1 multiplexing to yield the output. This process can be recursively done to yield a tree of multiplexers. Multiple methods exist for determining the groupings for a multiplexer tree. One such method that attempts to minimize area is described in [Mitra2000].

The selection inputs to an N-to-1 multiplexer may be represented in a variety of ways. At one extreme is using fully decoded enables where for each of N data inputs there is an enable input (or complementary pair of inputs) for selecting that data. This type of multiplexer should only be expected to behave properly when exactly one enable (pair) is active. This type of multiplexer is called "one-hot" because only one enable can be active or "hot". At the other extreme is using fully encoded selects where only $\log_2(N)$ (rounded up) select inputs are needed. These selects may be thought of as an address to a data input. Each select combination corresponds to selecting one of the N data inputs. Between these extremes ($\log_2(N)$ select inputs to N enable inputs), there may be other variations of how selection is represented.

When the selects are not fully decoded (less than N select inputs) for an N-to-1 multiplexer, the multiplexer implementation can usually be broken down into one or more one-hot multiplexers. One technique for using encoded selects is to use decoding logic to generate enables for a one-hot multiplexer. A second technique for using encoded selects is to use a tree of multiplexers. Each of the smaller multiplexers in that tree can then use some of the original encoded select inputs to generate a few decoded enables. A combination of decoding logic and a multiplexing tree might also be used. Because of the decomposition just discussed, a level of multiplexing within a tree will be considered to use one-hot multiplexing.

The conventional logic function used for one-hot multiplexing is a sum-of-products. This is shown in FIG. 1. The result is generated by an OR (sum) of ANDs (products) of enable/data pairs. This function may be transformed in a variety of ways using boolean algebra, DeMorgan's theorem, "bubble logic", etc. Since invalid conditions exist (when there is not just one enable active), this is not the only way to implement a one-hot multiplexing. Another logic function is a product-of-sums which is shown in FIG. 2. Note that the enables are inverted. A prime will denote an inverted signal (for example, E1' is inverted version of E1). This function is not commonly known and not fully exploited. In [Norwood1997], both the sum-of-products (FIG. 1) and product-of-sums (FIG. 2) functions are used, but only to model multiplexers for ATPG (to get a more robust pattern set).

Another place that the product-of-sums function is implicitly used is in standard tri-state multiplexers, which can be relatively small and fast. An inverting static CMOS implementation is shown in FIG. 3. The tri-state gates are 31, 32, and 33 in the multiplexer shown. The connections of 34 are optional for functionality and are used to provide parallel current paths for a given data selection. Ignoring these connections, the function of the N-type transistors (35) is an inverting product-of-sums like FIG. 1 and the function of the P-type transistors (36) is an inverting sum-of-products like FIG. 2. In U.S. Pat. No. 7,129,755 to Campbell (2004, these functions are used to decompose FIG. 3 into explicit AND2-OR2-INVERT and OR2-AND2-INVERT gates driving P-type pull-up and N-type pull-down transistors. One problem with variations of the tri-state multiplexers is that excess power may be used while the enables switch states (intermediate invalid states may create paths from power to ground). A second problem is that the original selects may be encoded such that the critical path has to through enable decoding logic, whereas the decoding logic would be unnecessary or simpler if a multiplexer tree were used. A third problem is that the output capacitance is linear to width of the multiplexer and can become dominate to the timing for wider multiplexers (compared to a balanced multiplexer tree that can have logarithmic timing with respect to the width of multiplexing). A fourth problem is that it can't be easily optimized with surrounding logic like a simple logic implementation. A fifth problem is that there are many more enables (N for an N-to-1 one-hot multiplexer instead of log(N) for a balanced multiplexer tree) which can create excess routing congestion. A sixth problem occurs when scannable sequential element generate these one-hot enables directly. In this case special handling is needed to prevent invalid high current enable states when (random) data is being scanned in and out. The speed and area benefits of tri-state type multiplexers come at the cost of a variety of issues that may outweigh those benefits.

A conventional AND/OR based 4-to-1 multiplexer tree is shown in FIG. 4A. It is implemented with two 2-to-1 multiplexing levels using sum-of-products (FIG. 1). An optimization of FIG. 4A is shown in FIG. 4B which uses NAND2 gates (usually the fastest 2-input gates for static CMOS gates). Using "bubble logic", FIG. 4A can be transformed to FIG. 4B by factoring bubbles out of the AND2 gates (leaving NAND2 gates) and pushing them forward through the OR2 gates (also leaving NAND2 gates). Using bubble logic in this way is equivalent to using boolean Algebra (especially DeMorgan's Theorem). Another reasonable static CMOS implementation is shown in FIG. 4C which uses complex AND2-OR2-INVERT and OR2-AND2-INVERT gates. FIG. 4C can be derived from FIG. 4A by factoring bubbles from the outputs of the first level of multiplexing (leaving AND2-OR2-IN- VERT gates) and pushing them forward all the way through the second level of multiplexing (yielding an OR2-AND2-INVERT gate).

Note that conventional AND/OR one-hot multiplexing implementations only take advantage of the sum-of-products multiplexing function (FIG. 1).

SUMMARY OF THE INVENTION

In the present invention, the one-hot nature of multiplexing is taken advantage of, but not using the conventional approach of using tri-state drivers or transmission gates. Instead, either the product-of-sums or sum-of-products representation of each one-hot multiplexing function is used such that optimizations can be made between levels of multiplexing.

DETAILED DESCRIPTION

Figure 4B:
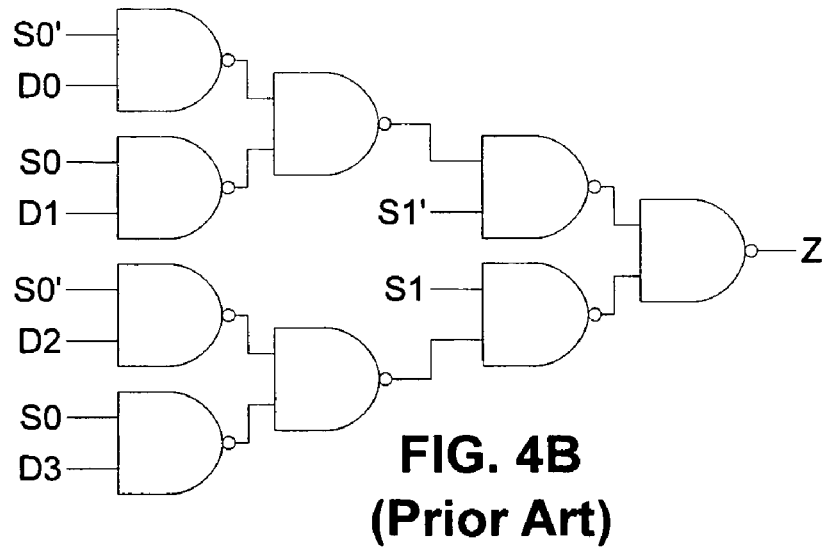
FIG. 4B shows an implementation of FIG. 4A using four NAND2 stages.
Figure 5A:
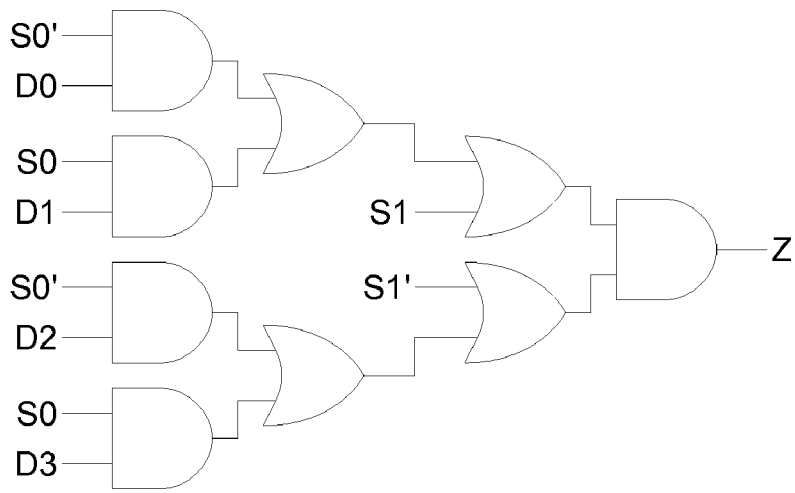
FIG. 5A shows 4-to-1 multiplexing implemented using a sum-of-products 2-to-1 multiplexing level followed by a product-of-sums 2-to-1 multiplexing level.
Figure 5B:
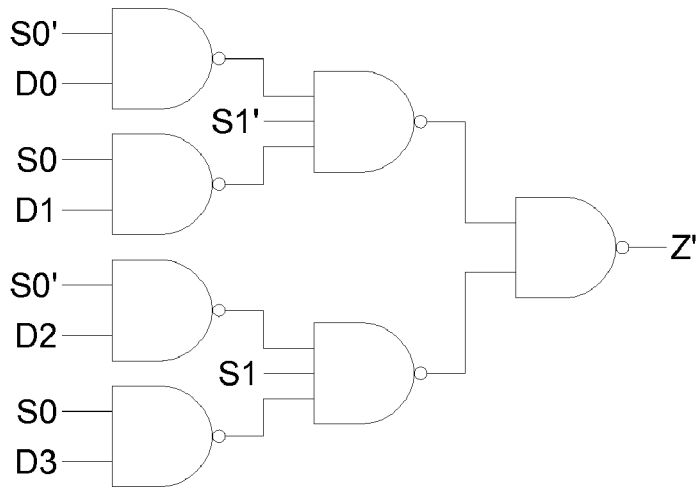
FIG. 5B shows an implementation of FIG. 5A using a NAND2 stage followed by a NAND3 stage followed by a NAND2 stage.
Figure 5C:
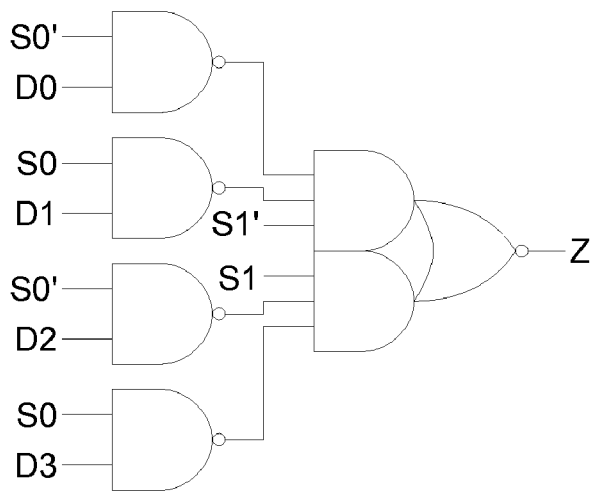
FIG. 5C shows an implementation of FIG. 5A using a NAND2 stage followed by an AND3-OR2-INVERT stage.

In FIG. 5A, an AND/OR based 4-to-1 multiplexer tree is shown which uses sum-of-products in the first multiplexing level and product-of-sums in the second multiplexing level. The advantage of mixing these two functions is that the OR2 gates from the first multiplexing level feed the OR2 gates of the second multiplexing level so that they can be combined as OR3 gates (using the associative property). After factoring bubbles out of the AND2 gates and pushing them forward through the combined OR3 gates, the structure of FIG. 5B can be achieved (although the output is inverted). In this structure, the gates of the first level are for "input enabling", the gates of the middle level are for "enabled funneling" of its previous level, and the final gate is for "output funneling" the results of its previous level. Using static CMOS gates, the NAND2->NAND3->NAND2 structure of FIG. 5B should be faster and smaller than the conventional structure of FIG. 4B using 4 levels of NAND2s. FIG. 5C shows another reasonable static CMOS solution, which can be found by pushing the NAND3 bubbles forward through the final NAND2 gate and combining those two stages to yield an AND3-OR2-INVERT complex gate. In this structure the "enabled funneling" and "output funneling" stages are combined using a complex gate.

Figure 6A:
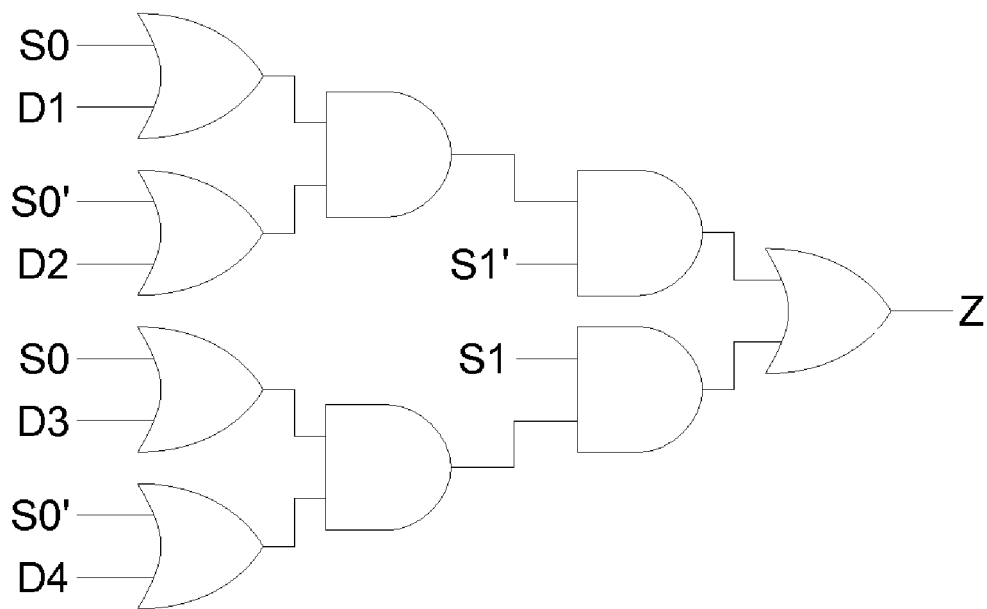
FIG. 6A shows 4-to-1 multiplexing implemented using a product-of-sums 2-to-1 multiplexing level followed by a sum-of-products 2-to-1 multiplexing level.
Figure 6B:
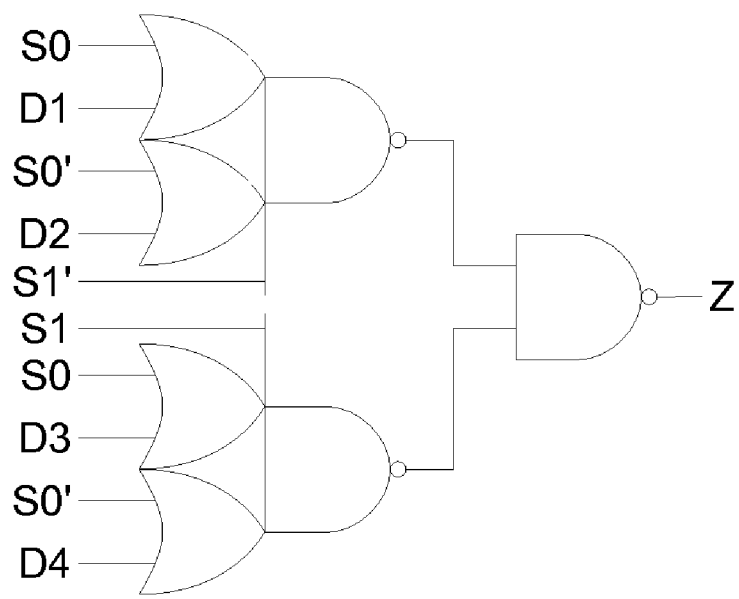
FIG. 6B shows an implementation of FIG. 6A using an OR2-AND3-INVERT stage followed by a NAND3 stage.

FIG. 6A shows yet another way to form an AND/OR based 4-to-1 multiplexer tree. This figure shows a product-of-sums function used in the first multiplexing level and a sum-of-products function used in the second multiplexing level. Since the AND2 gates of the first multiplexing level feed AND2 gates of the second multiplexing level, they can be combined to form AND3 gates. When bubbles are factored out of those AND3 gates and pushed forward through the final OR2 gate, the structure of FIG. 6B can be obtained. Using static CMOS gates, this structure having a stage of OR2-AND3-INVERT complex gates followed by a NAND2 gate should be faster and smaller than the AND2-OR2-INVERT->OR2-AND2-INVERT structure of FIG. 4C. In FIG. 6B, the "input enabling" is combined with "enabled funneling" stage using complex gates.

The same ideas can be applied to wider one-hot multiplexing levels and to a mixture of widths (including within the same level). Several 6-to-1 multiplexer tree implementations are shown in FIG. 7A-9B to demonstrate using 2-to-1 and 3-to-1 multiplexing levels.

Figure 7A:
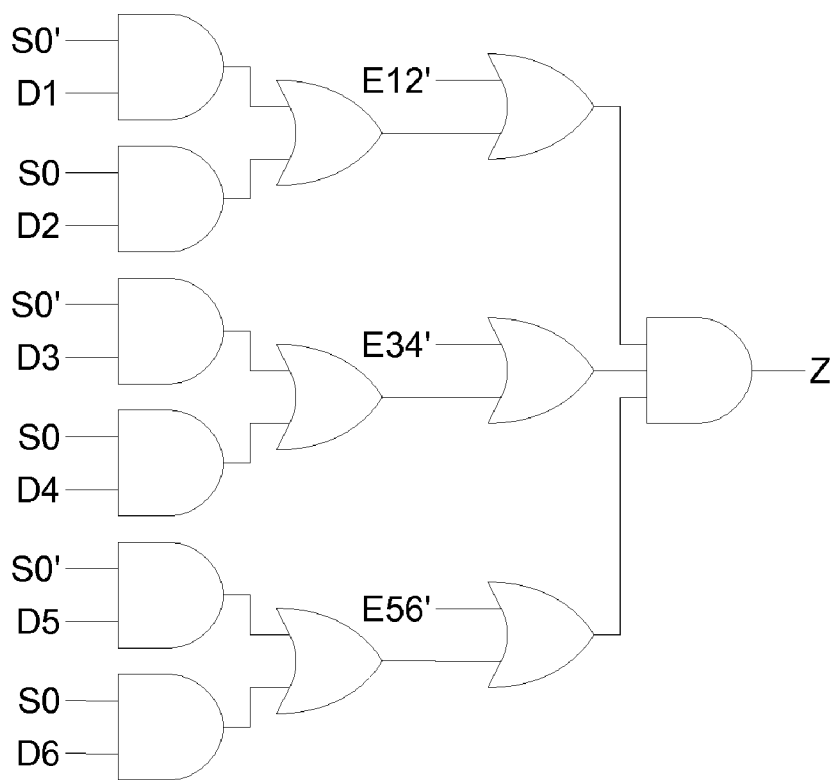
FIG. 7A shows 6-to-1 multiplexing implemented using a sum-of-products 2-to-1 multiplexing level followed by a product-of-sums 3-to-1 multiplexing level.
Figure 7B:
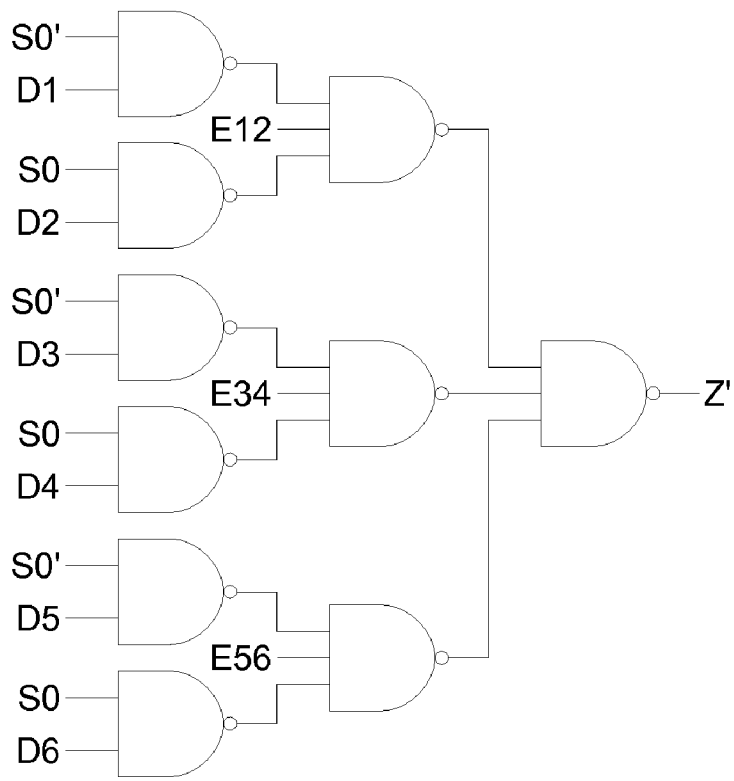
FIG. 7B shows an implementation of FIG. 7A using a NAND2 stage followed by two NAND3 stages.

In FIG. 7A, a 6-to-1 multiplexer is shown using a 2-to-1 sum-of-products multiplexing level followed by a 3-to-1 product-of-sums multiplexing level. After combining the OR gates and factoring/pushing bubbles, the implementation of FIG. 7B can be achieved. This is similar to the 4-to-1 multiplexer of FIG. 5B except that the NAND2 "output funneling" stage of FIG. 5B is a NAND3 stage in FIG. 7B.

Figure 8A:
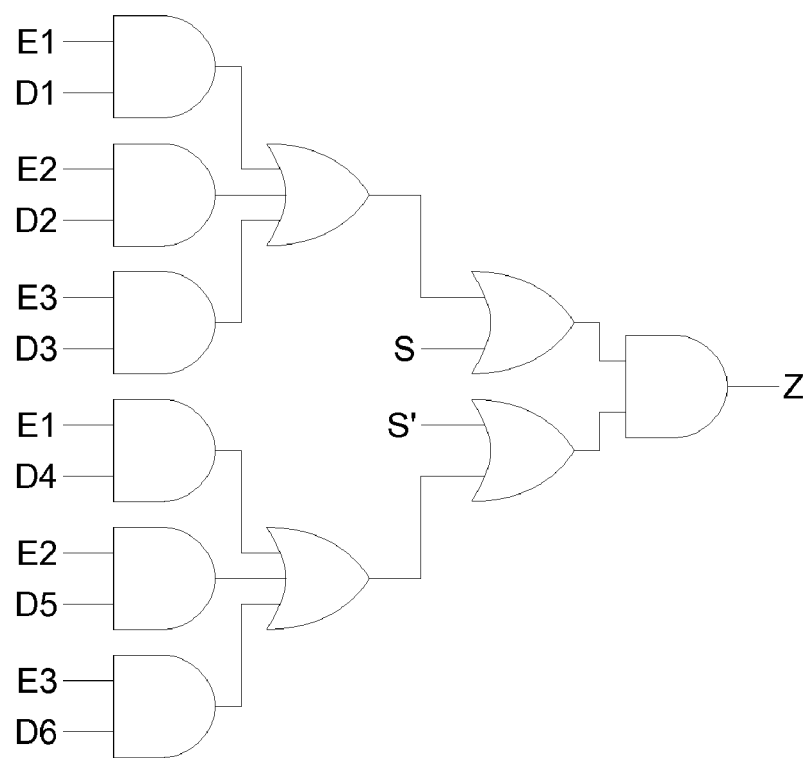
FIG. 8A shows 6-to-1 multiplexing implemented using a sum-of-products 3-to-1 multiplexing level followed by a product-of-sums 2-to-1 multiplexing level.
Figure 8B:
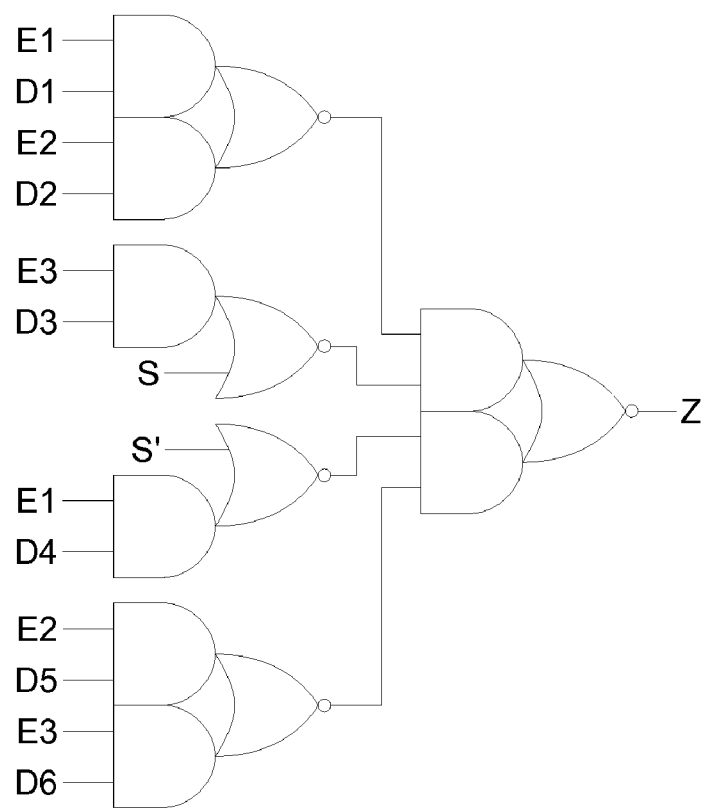
FIG. 8B shows an implementation of FIG. 8A using two AND2-OR2-INVERT stages.

In FIG. 8A, a 6-to-1 multiplexer is shown using a 3-to-1 sum-of-products multiplexing level followed by a 2-to-1 product-of-sums multiplexing level. The OR3 from the first multiplexing level can be combined with an OR2 from the second multiplexing level to yield an OR4 function (for "enabled funneling"). One possible implementation would be to factor bubbles out of the first stage of AND gates and push them forward through the OR4 gates to yield NAND4 gates. The result would be similar to FIG. 5B except the middle NAND3 stage would be a NAND4 stage. An implementation similar to FIG. 5C is also possible with the last stage being an AND4-OR2-INVERT gate instead of AND3-OR2-INVERT. Another implementation is shown in FIG. 8B. In this implementation, the OR4 functions are split into two levels. Bubbles are factored out of the first of these two levels and pushed forward through the rest of the logic. The result of this is two stages of AND2-OR2-INVERT gates. In this case the "enabled funneling" OR4 functions are each split with the first half combined with the "input enabling" functions and the second half combined with the "output funneling" function.

Figure 9A:
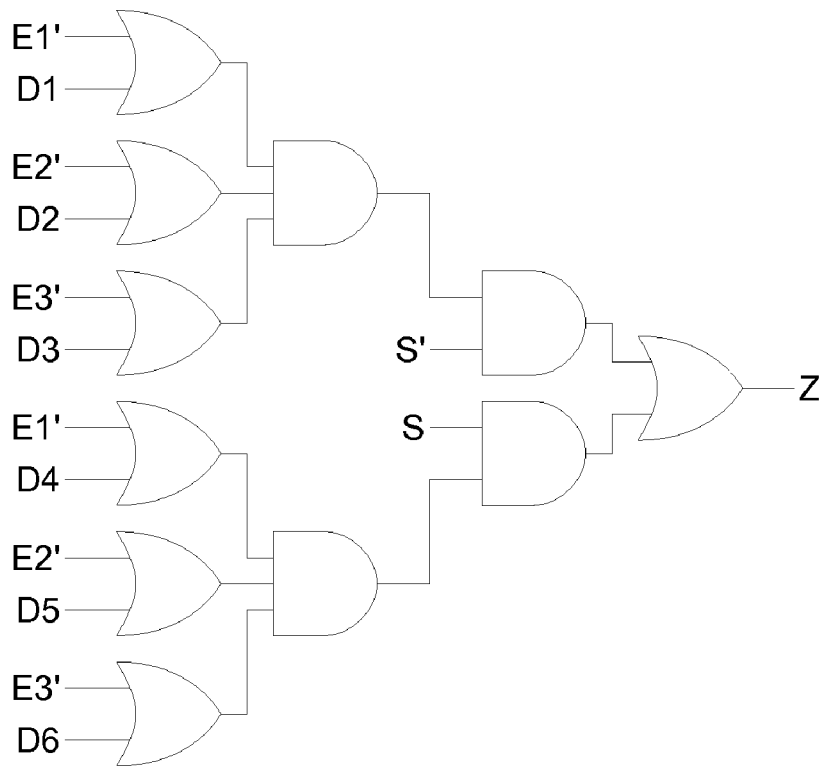
FIG. 9A shows 6-to-1 multiplexing implemented using a product-of-sums 3-to-1 multiplexing level followed by a sum-of-products 2-to-1 multiplexing level.
Figure 9B:
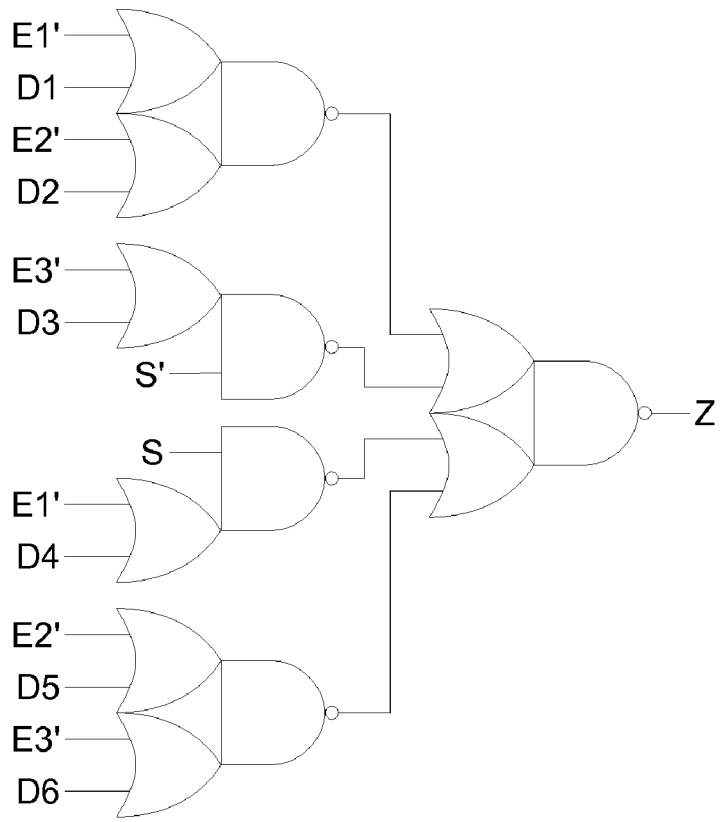
FIG. 9B shows an implementation of FIG. 9A using two OR2-AND2-INVERT stages.

In FIG. 9A, a 6-to-1 multiplexer is shown using a 3-to-1 product-of-sums multiplexing level followed by a 2-to-1 sum-of-products multiplexing level. The AND3 from the first multiplexing level can be combined with an AND2 from the second multiplexing level to yield an AND4 function. One reasonable static CMOS implementation would be to similar to FIG. 6B with the first stage using OR2-AND4-INVERT gates instead of OR2-AND3-INVERT gates. Another implementation is shown in FIG. 9B, which is derived similar to the way FIG. 8B is derived from FIG. 8A. The AND4 functions are split into two levels, bubbles are factored out of the first level and pushed forward through the rest of the logic. The result is two stages of OR2-AND2-INVERT gates. Comparing the new 6-to-1 multiplexers of FIG. 8B and FIG. 9B to the conventional 4-to-1 multiplexer of FIG. 4C, the new 6-to-1 multiplexers have the same or better performance than the conventional 4-to-1 multiplexer since all three implementations use two levels of OR2-AND2-INVERT or AND2-OR2-INVERT gates. The performance of these new 6-to-1 multiplexers should also be on par with conventional a 6-to-1 tree implementation using a tri-state type 3-to-1 multiplexing level.

Figure 1:
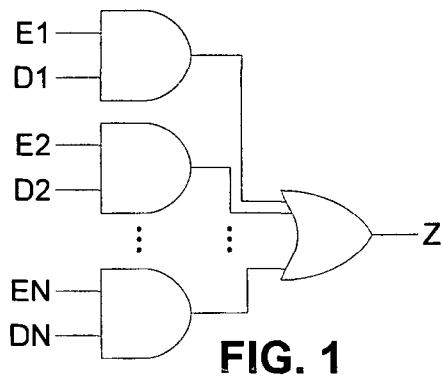
FIG. 1 shows a traditional sum-of-products representation of one-hot multiplexing.
Figure 2:
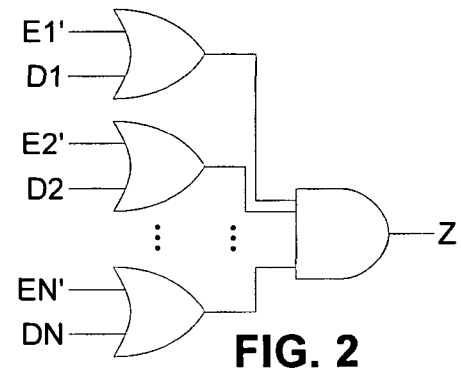
FIG. 2 shows a product-of-sums representation of one-hot multiplexing.
Figure 3:
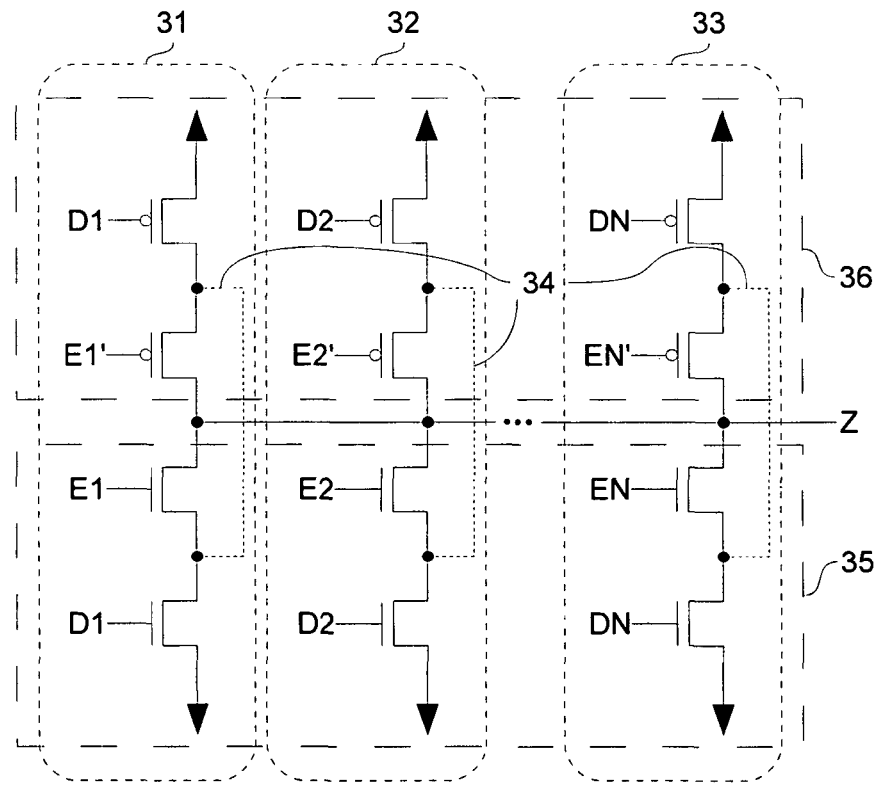
FIG. 3 shows a conventional tri-state implementation of one-hot multiplexing.
Figure 4A:
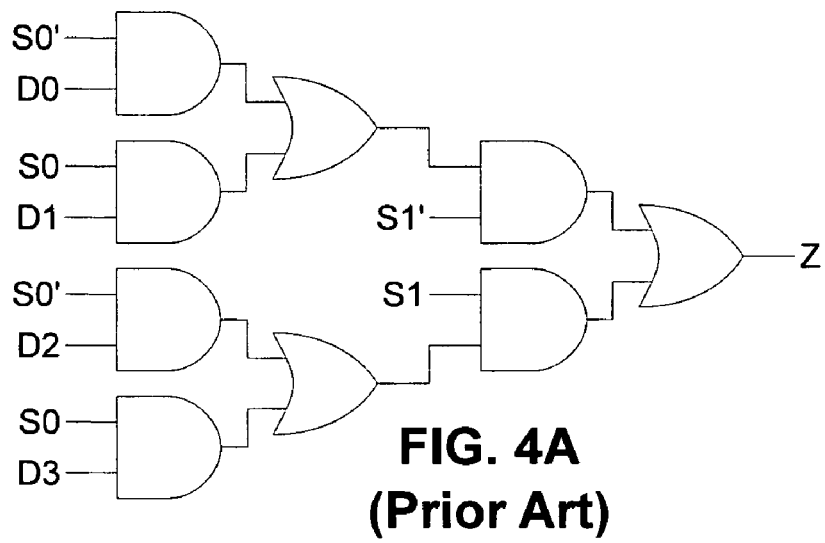
FIG. 4A shows 4-to-1 multiplexing implemented using two sum-of-products 2-to-1 multiplexing levels.
Figure 4C:
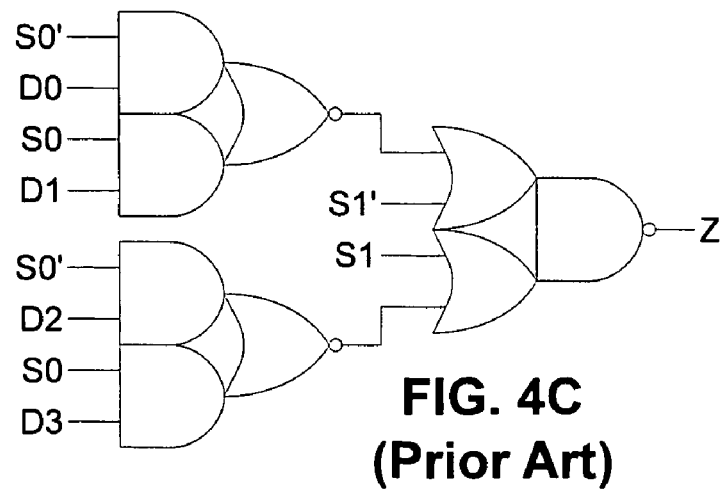
FIG. 4C shows an implementation of FIG. 4A using an AND2-OR2-INVERT stage followed by an OR2-AND2-INVERT stage.
Figure 10A:
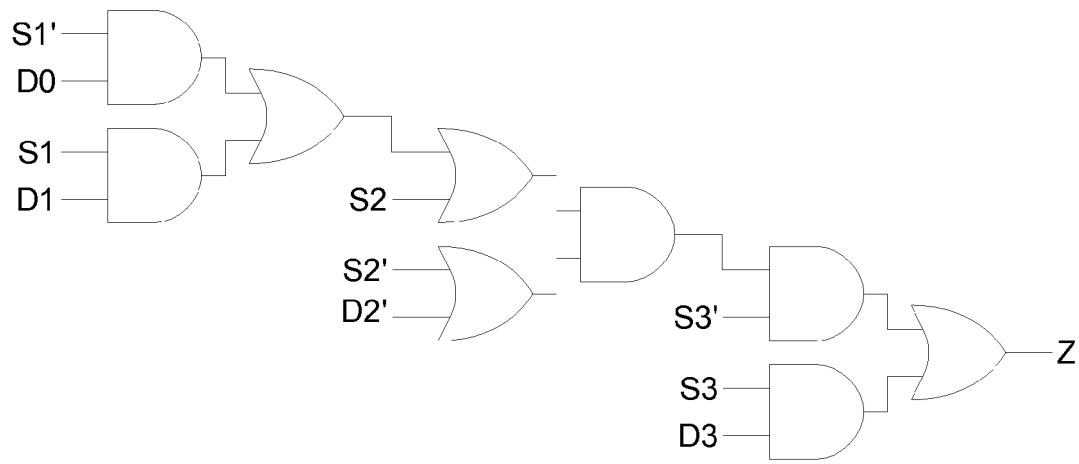
FIG. 10A shows priority encoded 4-to-1 multiplexing implemented using three 2-to-1 multiplexing levels that alternate between sum-of-products and product-of-sums.
Figure 10B:
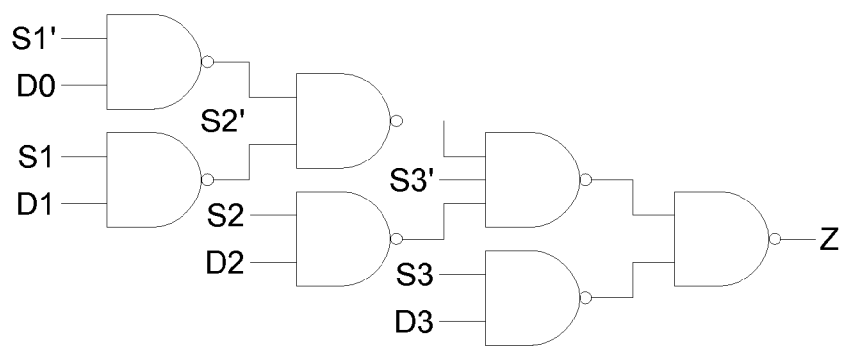
FIG. 10B shows an implementation of FIG. 10A with four levels of NAND gates.

In FIG. 10A, 4-to-1 priority encoded multiplexing is shown to demonstrate having 3 levels and some asymmetry. The first level uses sum-of-products, the second level uses product-of-sums, and the last level sum-of-products. Transformations are done similar to previous examples to yield FIG. 10B. In this structure, the input NAND2 gates do the "input enabling", the two NAND3 gates/levels perform the "enabled funneling", the final NAND2 gate does the "output funneling".

The techniques described above can be applied to deeper multiplexer trees. A good approach is to alternate using product-of-sums and sum-of-products in the multiplexer levels. Given N-to-1 product-of-sums (sum-of-products) multiplexing followed by sum-of-products (product-of-sums) multiplexing, the N input AND (OR) of the given N-to-1 multiplexing can be combined with the 2 input AND (OR) of the following multiplexing level to yield an N+1 input AND (OR) function. The conventional approach yields an AND2 followed by and an N input OR for each N-to-1 multiplexing level whereas this new approach yields each transformed level having an OR or AND function with N+1 inputs. Existing techniques (i.e. boolean algebra) can be used to rearrange, transform, and implement these logic levels.

Sometimes not alternating product-of-sums and sum-of-products in a multiplexer (tree) may also be useful. When the signal polarities don't allow using a preferred logic gate (i.e. NAND instead of NOR for CMOS), additional inverters are needed for driving wires/loads, or other reasons, it may be useful to have two or more consecutive multiplexing levels use just product-of-sums or sum-of-products. Also, it may be useful for some multiplexing to use tri-state type multiplexers or other discrete multiplexers.

Optimizations may also occur at the boundary of multiplexing. For example, if the output of the multiplexing feeds an ANDing (ORing) function, it may be better to use product-of-sums (sum-of-products) at the last level of multiplexing. Doing this would allow the following AND (OR) function to be merged with the final AND (OR) of the multiplexing function. Similarly, a product-of-sums or sum-of-products function may be chosen for the first level of multiplexing based on the logic preceding the multiplexing. Another factor for choosing product-of-sums or sum-of-products for the first and last level for a multiplexing function may be the signal polarities desired or given. A better choice may result in more preferred gates (NAND for CMOS) being used.

The examples given above are optimized for CMOS static gates. The same ideas can be applied to any other logic family. The differences would be what gates are available and what the preferred gates are. For example, with NMOS gates, NOR gates are better than NAND, so the transformations should be done in a way to make more NOR type gates for NMOS. Clocked logic families such as domino or zipper domino could also use these techniques. Non-electronic logic families (i.e. optical logic gates) would also benefit.

Operation

The method described is used during logic or circuit design. The techniques described might be used manually, by software that generates logic or circuitry, or by other means. Multiplexing functions might be identified from a high-level description that includes constructs that represent or infer multiplexing. Additional methods may be needed to complete multiplexing functions that are not described here. This may include but is not limited to building decoding logic for selection and determining the number of levels and widths of multiplexing for a multiplexing tree. The method described here may be just part of a higher level method that implements complete multiplexing functions.

What is claimed is:

1. A multiplexer, comprising:
   a) a plurality of enable signals, each with predetermined active and inactive binary states;
   b) a plurality of enabled data signals, each with predetermined active and inactive binary states;
   c) a plurality of enabling functions for generating some of said enabled data signals, each receiving one of said enable signals and driving one of said enabled data signals inactive when the received enable signal is inactive;
   d) a plurality of enabled funneling functions for generating the remainder of said enabled data signals, each receiving a plurality of said enabled data signals and one of said enable signals and driving another one of the said enabled data signals active when the received enable signal is active and all of the received enabled data signals are inactive;
   e) an output funneling function receiving a plurality of said enabled data signals and driving a multiplexed output signal to a predetermined binary state when all of the received enabled data signals are inactive.

2. The multiplexer of claim 1 wherein one or more said enabling functions each receive an input data signal.

3. The multiplexer of claim 1 wherein one or more of said enable signals are each shared among a subset of said enabling functions and/or said enabled funneling functions.

4. The multiplexer of claim 1, further including one or more select signals each coupled to activate a subset of said enable signals and inactivate another subset of said enable signals.

5. The multiplexer of claim 1 wherein a subset of said enable signals are ensured to be complementary to another subset of said enable signals.

6. The multiplexer of claim 1 wherein one of more of said enabled funneling functions may be split and are combined with preceding and/or following functions such that said enabled data signals used in the combinations may be implicit or embedded.

7. The multiplexer of claim 1, further including additional logic integrated into at least one of said enabling functions such that some of said enable signals used by said enabling functions may be implicit or embedded.

8. The multiplexer of claim 1, further including additional logic integrated into said output funneling function.

9. The multiplexer of claim 1, further including additional logic integrated into at least one of said enabled funneling functions such that some of said enable signals used by said enabling functions may be implicit or embedded.

10. The multiplexer of claim 1 wherein one or more of said enabled funneling functions are each implemented with a single stage gate.

11. The multiplexer of claim 1 wherein one or more of said enabled funneling functions are each implemented with a plurality of gates.

12. The multiplexer of claim 1 wherein said output funneling function is implemented with a plurality of gates.

13. The multiplexer of claim 1 wherein one or more of said enabling functions are each implemented with a plurality of gates.

14. A method of implementing a tree of multiplexing functions, which are connected by a plurality of data signals and each of said multiplexing functions receives a subset of a plurality of enable signals, wherein the method comprises:
  a) transforming each of said multiplexing functions to a multiplexing boolean logic function that is equivalent to a function with a plurality of alternating OR and AND levels, having alternatives ending in either OR or AND made possible because of don't care states in said multiplexing functions, and with possible input inversions;
  b) transforming said tree of multiplexing boolean logic functions to a compressed multi-level multiplexing function by combining the output OR or AND function with the input OR or AND function, between each interconnected pair of said multiplexing boolean logic functions, into a equivalent larger OR or AND function with possible input inversions such that said data signals are not directly used or represented in said compressed multi-level multiplexing function.

15. The method of claim 14, further including inferring one or more of said multiplexing functions from case statements or other conditional statements in a language used for describing hardware.

16. The method of claim 14, further including performing one or more logic optimizations on the compressed multi-level multiplexing function so that more efficient gates may be used in the implementation.

17. The method of claim 14, further including dividing a larger multiplexing function to yield one or more of said multiplexing functions.

18. The method of claim 14, further including repeating the steps with alternatives to achieve better results.

19. The method of claim 14 wherein both of said transforming steps may be applied one level, stage, or multiplexing function at a time such that the intermediate multiplexing boolean logic function may be only implicit.

* * * * *